United States Patent
Kotegawa et al.

(10) Patent No.: US 11,790,883 B2
(45) Date of Patent: Oct. 17, 2023

(54) ACTIVE NOISE REDUCTION DEVICE, VEHICLE, AND ACTIVE NOISE REDUCTION METHOD

(71) Applicant: Panasonic Intellectual Property Management Co., Ltd., Osaka (JP)

(72) Inventors: Kazuhisa Kotegawa, Osaka (JP); Mitsuhiro Tani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/751,250

(22) Filed: May 23, 2022

(65) Prior Publication Data

US 2022/0284881 A1    Sep. 8, 2022

Related U.S. Application Data (63) Continuation of application No. PCT/JP2020/043146, filed on Nov. 19, 2020.

(30) Foreign Application Priority Data

Nov. 29, 2019 (JP) ................................. 2019-216574

(51) Int. Cl.
G10K 11/178 (2006.01)

(52) U.S. Cl.
CPC .. G10K 11/17883 (2018.01); G10K 11/17823 (2018.01); G10K 11/17825 (2018.01); G10K 11/17854 (2018.01)

(58) Field of Classification Search
CPC ....... G10K 11/17827; G10K 11/17817; G10K 11/1783; G10K 11/17819; G10K 11/17835
See application file for complete search history.

(56) References Cited

U.S. PATENT DOCUMENTS

| 2015/0228292 A1* | 8/2015 | Goldstein | ........ G10K 11/17817 |
| | | | 381/71.6 |
| 2020/0342846 A1* | 10/2020 | Cai | .................. G10K 11/17873 |

FOREIGN PATENT DOCUMENTS

| JP | H06-022389 | 1/1994 |
| JP | H10-207470 | 8/1998 |

OTHER PUBLICATIONS

International Search Report issued in International Bureau of WIPO Patent Application No. PCT/JP2020/043146, dated Feb. 2, 2021, along with an English translation thereof.

(Continued)

*Primary Examiner* — Kile O Blair
(74) *Attorney, Agent, or Firm* — GREENBLUM & BERNSTEIN, P.L.C.

(57) ABSTRACT

An active noise reduction device includes: a reference signal input terminal that receives a reference signal from a reference signal source attached to an automobile; a simulated vibration transfer characteristics filter unit that generates a second signal by correcting, using simulated vibration transfer characteristics, a first signal for outputting, from a loudspeaker attached to the automobile, a sound different from a canceling sound, the simulated vibration transfer characteristics simulating vibration transfer characteristics from the loudspeaker to the reference signal source; a first subtracter that outputs a corrected reference signal obtained by subtracting the second signal generated, from the reference signal received by the reference signal input terminal; and an adaptive filter unit that applies an adaptive filter to the corrected reference signal outputted from the first subtracter to generate a canceling signal to be used to output the canceling sound.

8 Claims, 6 Drawing Sheets

(56) References Cited

OTHER PUBLICATIONS

Notice of Reasons for Refusal dated Jul. 11, 2023 for the corresponding Japanese Patent Application No. 2019-216574, along with an English translation thereof.

* cited by examiner

ACTIVE NOISE REDUCTION DEVICE, VEHICLE, AND ACTIVE NOISE REDUCTION METHOD

CROSS REFERENCE TO RELATED APPLICATIONS

This is a continuation application of PCT International Application No. No. PCT/JP2020/043146 filed on Nov. 19, 2020, designating the United States of America, which is based on and claims priority of Japanese Patent Application No, 2019-216574 filed on Nov. 29, 2019.

FIELD

The present disclosure relates to an active noise reduction device that actively reduces noise by interfering a canceling sound with the noise, a vehicle including the active noise reduction device, and an active noise reduction method.

BACKGROUND

Conventionally, an active noise reduction device has been known that actively reduces noise by outputting a canceling sound for canceling out the noise from a canceling sound source using a reference signal having a correlation with the noise and an error signal that is based on a residual sound resulting from interference between the noise and the canceling sound in a predetermined space (see, for example, Patent Literature (PTL) 1). The active noise reduction device updates an adaptive filter based on a coefficient updating algorithm and convolves the reference signal with the adaptive filter to generate a canceling signal for outputting a canceling sound.

CITATION LIST

Patent Literature

PTL 1: Japanese Unexamined Patent Application Publication No. 10-207470

SUMMARY

The present disclosure provides an active noise reduction device capable of improving upon the above related art.

An active noise reduction device according to one aspect of the present disclosure includes: a reference signal input that receives a reference signal outputted by a reference signal source and having a correlation with noise in a space in a vehicle the reference signal source being attached to the vehicle; a simulated vibration transfer characteristics filter unit that generates a second signal by correcting, using simulated vibration transfer characteristics, a first signal for outputting, from a loudspeaker attached to the vehicle, a sound different from a canceling sound for reducing the noise, the simulated vibration transfer characteristics simulating vibration transfer characteristics from the loudspeaker to the reference signal source; a first subtracter that outputs a corrected reference signal obtained by subtracting the second signal generated, from the reference signal received by the reference signal input; and an adaptive filter unit that applies an adaptive filter to the corrected reference signal outputted from the first subtracter to generate a canceling signal to be used to output the canceling sound.

An active noise reduction device according to the present disclosure is capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENTS

The following specifically describes embodiments with reference to the drawings. Note that each embodiment described below shows a general or specific example. The numerical values, shapes, materials, structural elements, the arrangement and connection of the structural elements, steps, the order of the steps, etc. mentioned in the following embodiments are mere examples and not intended to limit the present disclosure. Of the structural elements in the following embodiments, structural elements not recited in any one of the independent claims are described as optional structural elements.

Each diagram is a schematic diagram, and not necessarily a precise illustration. Note that throughout the figures, structural elements that are essentially the same share like reference signs, and duplicate description is omitted or simplified.

Embodiment 1

[Configuration of Automobile including Active Noise Reduction Device]

Figure 1:
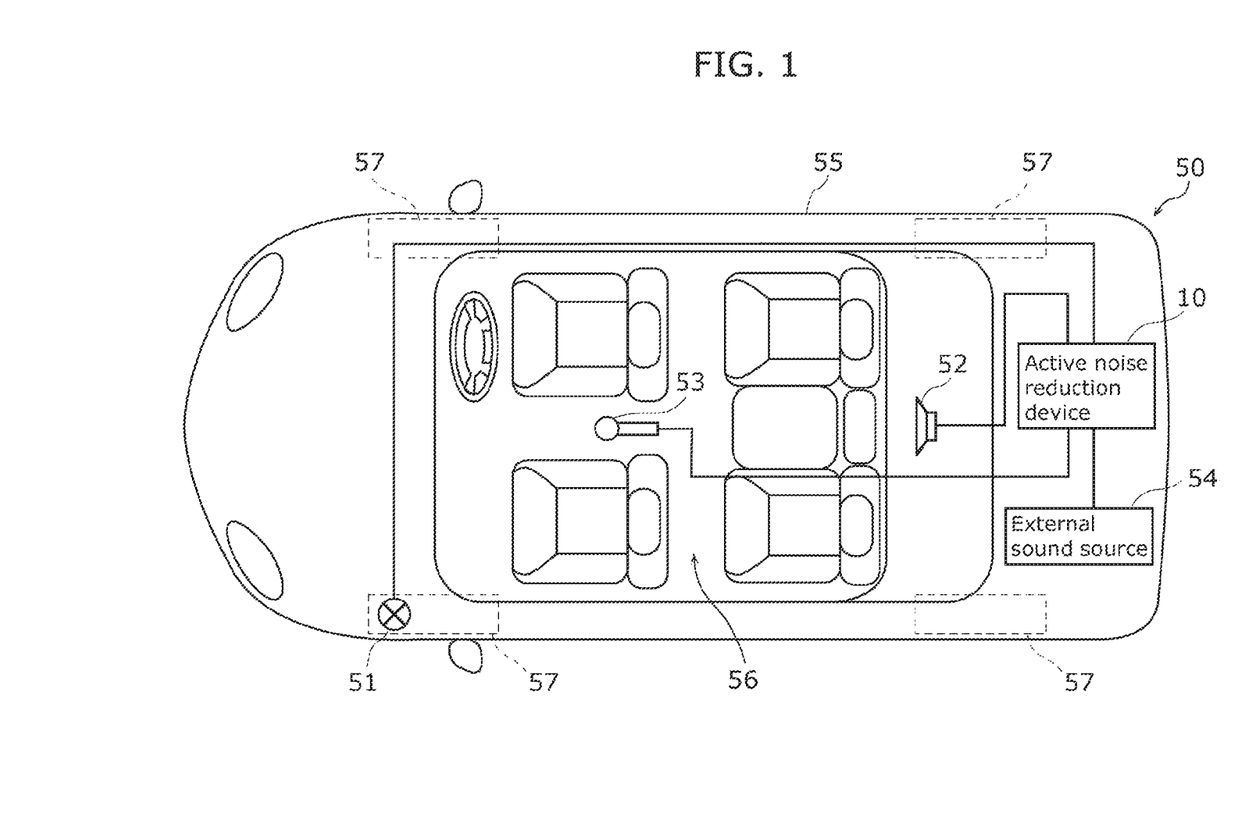
FIG. 1 is a schematic diagram of an automobile including an active noise reduction device according to Embodiment 1 as viewed from above.

Embodiment 1 describes an active noise reduction device mounted on an automobile. FIG. 1 is a schematic diagram of an automobile including an active noise reduction device according to Embodiment 1 as viewed from above.

Automobile 50 is an example of a vehicle. Automobile 50 includes active noise reduction device 10 according to Embodiment 1, reference signal source 51, loudspeaker 52, error signal source 53, external sound source 54, and automobile main body 55, and four wheels 57, Automobile 50 is specifically a passenger car, but is not particularly limited to a passenger car.

Reference signal source 51 is a transducer that outputs a reference signal having a correlation with noise in space 56 in a cabin of automobile 50. Here, noise also includes vibration. In Embodiment 1, reference signal source 51 is an acceleration sensor and is disposed outside space 56, In the example in FIG. 1, reference signal source 51 is attached to the subframe near the left front wheel, but may be attached to a wheel housing or knuckle, for example. Reference signal source 51 may be attached to any position. Moreover, reference signal source 51 may be a microphone, Note that noise that is mainly targeted by active noise reduction device 10 is road noise, for example. Because of complexity of the propagation path of load noise, a configuration is useful in which an acceleration sensor is used as reference signal source 51.

Loudspeaker 52 outputs a canceling sound to space 56 using a canceling signal. Moreover, loudspeaker 52 outputs, for example, music to space 56 using a first signal outputted from external sound source 54. A plurality of loudspeakers 52 may be used in active noise reduction device 10, and loudspeakers 52 may be attached to any positions.

Error signal source 53 detects a residual sound produced by interference between noise and a canceling sound in space 56 and outputs an error signal based on the residual sound, Error signal source 53 is a transducer, such as a microphone, and is desirable to be disposed in space 56, for example, on a headliner. Note that automobile 50 may include a plurality of error signal sources 53.

External sound source 54 is, for example, an audio playback device that outputs audio signals for a listener to enjoy music in space 56. External sound source 54 is another active noise reduction device other than active noise reduction device 10, and may be a canceling signal outputted by the other active noise reduction device. The other active noise reduction device is, for example, a device that reduces an engine muffled sound, based on a signal having a correlation with an engine speed. In addition, external sound source 54 is a device that generates a sound source of active sound control (ASC), and may output a signal to be used for the ASC. External sound source 54 may output a signal of a warning tone (e.g., a beep) relating to a use condition of automobile 50. A signal outputted from external sound source 54 is also referred to as a first signal.

Automobile main body 55 is a structure including a chassis, a body, and the like of automobile 50. Automobile main body 55 forms space 56 (the space in the automobile cabin) in which loudspeaker 52, error signal source 53, and external sound source 54 are disposed.

[Configuration of Active Noise Reduction Device]

Figure 2:
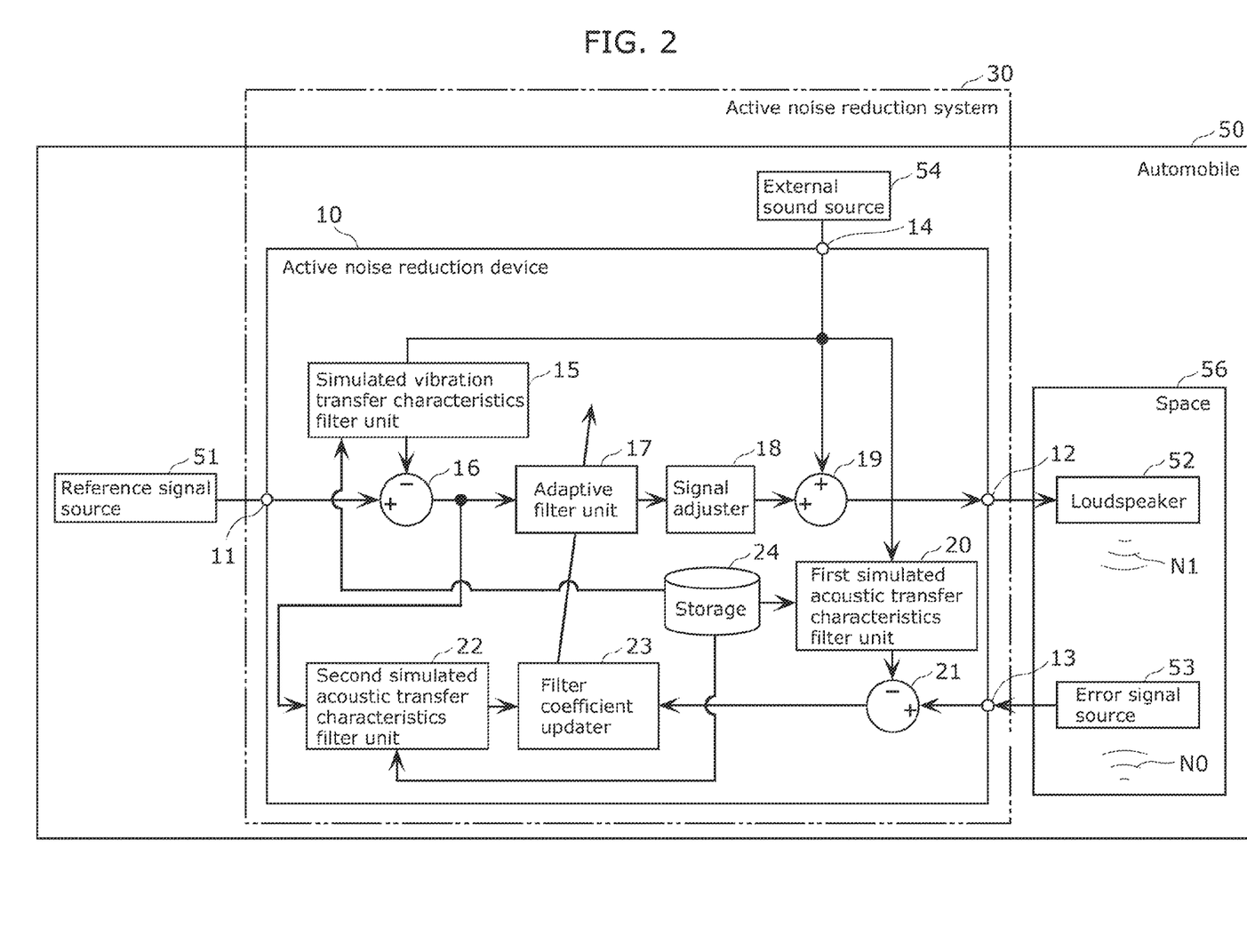
FIG. 2 is a block diagram illustrating a functional configuration of the active noise reduction device according to Embodiment 1.

Next, a configuration of active noise reduction device 10 will be described. FIG. 2 is a block diagram illustrating a functional configuration of active noise reduction device 10.

As illustrated in FIG. 2, active noise reduction device 10 includes: reference signal input terminal 11; canceling signal output terminal 12; error signal input terminal 13; external signal input terminal 14; simulated vibration transfer characteristics filter unit 15; first subtracter 16; adaptive filter unit 17; signal adjuster 18; adder 19; first simulated acoustic transfer characteristics filter unit 20; second subtracter 21; second simulated acoustic transfer characteristics filter unit 22; filter coefficient updater 23; and storage 24.

Reference signal input terminal 11, canceling signal output terminal 12, error signal input terminal 13, and external signal input terminal 14 are each a terminal made of a material such as metal, for example.

Simulated vibration transfer characteristics filter unit 15, first subtracter 16, adaptive filter unit 17, signal adjuster 18, adder 19, first simulated acoustic transfer characteristics filter unit 20, second subtracter 21, second simulated acoustic transfer characteristics filter unit 22, and filter coefficient updater 23 (hereinafter also referred to as simulated vibration transfer characteristics filter unit 15, etc.) may be implemented, for example, by executing software by a processor, such as a digital signal processor (DSP) or a microcomputer.

Simulated vibration transfer characteristics filter unit 15, etc. may be implemented by hardware, such as circuitry. Moreover, part of simulated vibration transfer characteristics filter unit 15, etc. may be implemented by software and the remaining ones may be implemented by hardware. For example, first subtracter 16 and second subtracter 21 may be implemented by a subtracting circuit including an operational amplifier. Moreover, for example, adder 19 may be implemented by an adding circuit including an operational amplifier.

Storage 24 is a storage device that stores, for example, simulated vibration transfer characteristics and simulated acoustic transfer characteristics, which will be described later. Specifically, storage 24 is implemented by semiconductor memory, for example. Note that when simulated vibration transfer characteristics filter unit 15, etc. are implemented by a processor, such as a DSP, a control program to be executed by the processor is also stored in storage 24. Storage 24 may also store other parameters to be used for signal processing performed by simulated vibration transfer characteristics filter unit 15, etc.

Note that active noise reduction device 10 and external sound source 54 may be implemented as active noise reduction system 30. Active noise reduction system 30 is specifically an in-vehicle infotainment (IVI) device, an audio amplifier or the like. Active noise reduction device 10, the IVI device, the audio amplifier, or the like each may include separate units that are connected by automobile harness, etc., or may be integrated as a single system.

[Operation]

In space 56 in automobile 50, synthetic sound N1 is output from speaker 52. Synthetic sound N1 is a sound obtained by synthesizing the canceling sound and a sound that is different from the canceling sound and based on external sound source 54, such as music. Here, the canceling sound is a sound for reducing noise N0. Therefore, it is better not to reduce a sound that is based on external sound source 54. However, if the vibration of loudspeaker 52 when loudspeaker 52 outputs synthetic sound N1 described above is transferred to reference signal source 51 (acceleration sensor) via a structure such as automobile main body 55, the reference signal may include signal components having a correlation with the sound based on external sound source 54. As a result, the canceling sound may also reduce the sound based on external sound source 54.

Figure 3:
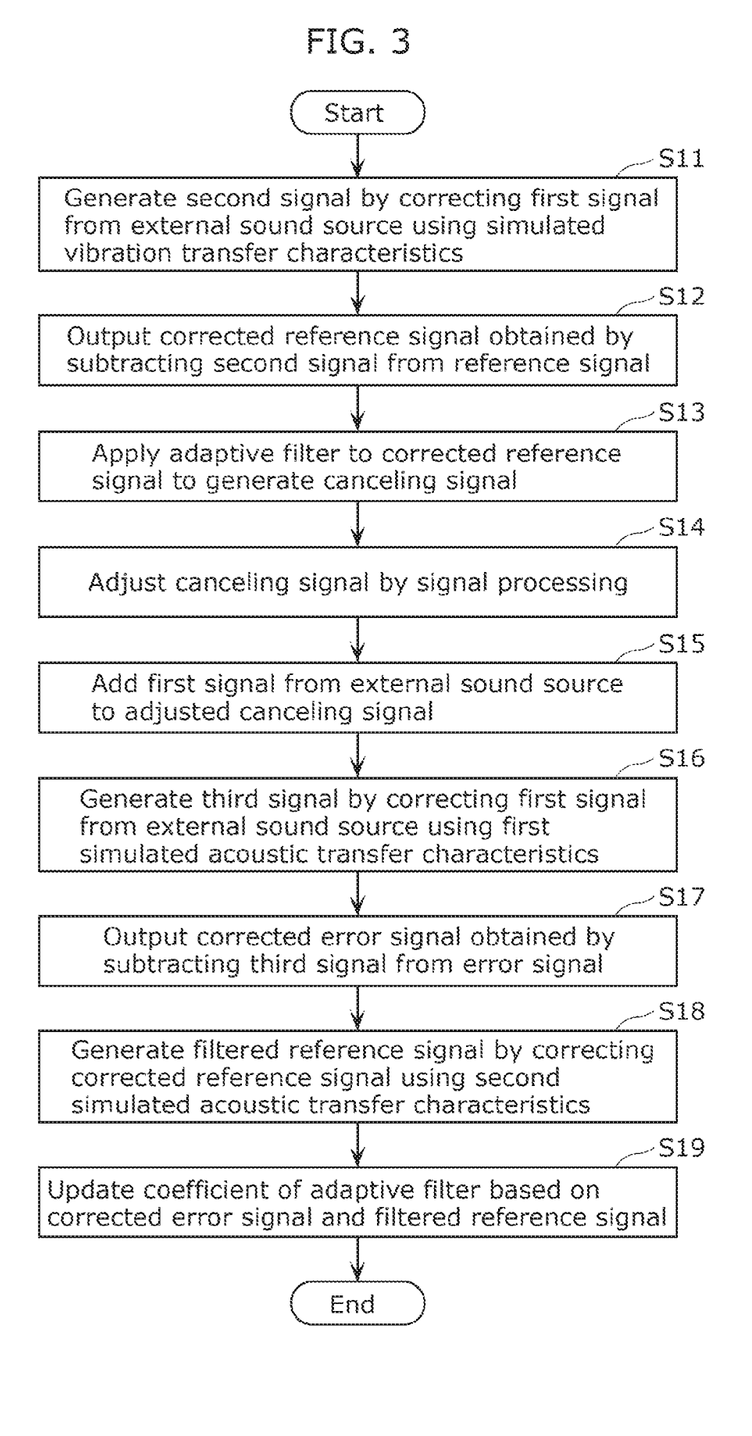
FIG. 3 is a flowchart of an operation of the active noise reduction device according to Embodiment 1.

To address such an issue, active noise reduction device 10 is configured such that a cancelling sound does not reduce the sound from external sound source 54. Hereinafter, an operation of such active noise reduction device 10 will be described with reference to FIG. 3 in addition to FIG. 2. FIG. 3 is a flowchart of an operation of active noise reduction device 10.

Simulated vibration transfer characteristics filter unit 15 generates a second signal by correcting, with simulated vibration transfer characteristics, a first signal inputted from external sound source 54 to external signal input terminal 14 (S11). Simulated vibration transfer characteristics are transfer characteristics that simulate vibration transfer characteristics from the position of loudspeaker 52 to the position of reference signal source 51. For example, simulated vibration transfer characteristics are measured and stored in storage 24, after reference signal source 51 and loudspeaker 52 are attached to automobile 50. Simulated vibration transfer characteristics filter unit 15 reads and uses the simulated vibration transfer characteristics stored in storage 24.

First subtracter 16 subtracts the generated second signal from the reference signal inputted to reference signal input terminal 11 and outputs a corrected reference signal obtained through this subtraction (S12).

Adaptive filter unit 17 generates a canceling signal by convolving an adaptive filter with the corrected reference signal outputted from first subtracter 16 (S13). Adaptive filter unit 17 is implemented by what is called a finite impulse response (FIR) filter or an infinite impulse response (IIR) filter. The generated canceling signal is outputted to signal adjuster 18.

Signal adjuster 18 adjusts the canceling signal generated by adaptive filter unit 17 by signal processing (S14). Signal adjuster 18 performs, for example, signal processing of multiplying the canceling signal by a gain. The adjusted canceling signal is outputted to adder 19. Note that signal adjuster 18 may be omitted. In this case, the canceling signal generated by adaptive filter unit 17 is outputted to adder 19.

Adder 19 adds a first signal inputted from external sound source 54 to external signal input terminal 14 to the adjusted canceling signal (S15). The canceling signal to which the first signal is added is outputted to loudspeaker 52 via canceling signal output terminal 12. As a result, synthetic sound N1, which is a sound obtained by synthesizing a canceling sound for reducing noise N0 and a sound based on external sound source 54, is outputted from speaker 52.

First simulated acoustic transfer characteristics filter unit 20 generates a third signal that is obtained by correcting, using the first simulated acoustic transfer characteristics, a first signal inputted from external sound source 54 to external signal input terminal 14 (S16). The first simulated acoustic transfer characteristics are transfer characteristics that simulate the acoustic transfer characteristics in space 56. More specifically, first simulated acoustic transfer characteristics are acoustic transfer characteristics that simulate acoustic transfer characteristics from the position of loudspeaker 52 to the position of error signal source 53. For example, the first simulated acoustic transfer characteristics are measured in space 56 and stored in storage 24 in advance. First simulated acoustic transfer characteristics filter unit 20 reads and uses the first simulated acoustic transfer characteristics stored in storage 24.

Second subtracter 21 subtracts the generated third signal from an error signal inputted to error signal input terminal 13 and outputs a corrected error signal obtained through this subtraction (S17). The error signal inputted to error signal input terminal 13 is a signal corresponding to a residual sound resulting from interference between synthetic sound N1 (including canceling sound) and noise N0, and outputted by error signal source 53.

Second simulated acoustic transfer characteristics filter unit 22 generates a filtered reference signal by correcting, using second simulated acoustic transfer characteristics, the corrected reference signal outputted from first subtracter 16 (S18). The second simulated acoustic transfer characteristics are transfer characteristics that simulate the acoustic transfer characteristics in space 56. More specifically, second simulated acoustic transfer characteristics are characteristics from immediately after the output of adaptive filter unit 17 to the input of the filter coefficient updater, and include characteristics of a signal adjuster. Second simulated acoustic transfer characteristics simulate acoustic transfer characteristics from the position of loudspeaker 52 to the position of error signal source 53. For example, the second simulated acoustic transfer characteristics are measured in space 56 and stored in storage 24 in advance. Second simulated acoustic transfer characteristics filter unit 22 reads and uses the second simulated acoustic transfer characteristics stored in storage 24.

Note that the second simulated acoustic transfer characteristics may be the same as or different from the first simulated acoustic transfer characteristics. If there is no signal adjuster 18, the second simulated acoustic transfer characteristics are the same as the first simulated acoustic transfer characteristics, and the simulated acoustic transfer characteristics stored in storage 24 are also used as the first simulated acoustic transfer characteristics and the second simulated acoustic transfer characteristics.

Filter coefficient updater 23 sequentially updates coefficient W of an adaptive filter using the corrected error signal outputted from second subtracter 21 and the filtered reference signal generated by second simulated acoustic transfer characteristics filter unit 22 (S19).

Specifically, filter coefficient updater 23 uses a least mean square (LMS) method to calculate coefficient W of the adaptive filter to minimize the sum of squares of the corrected error signal, and outputs the calculated coefficient of the adaptive filter to adaptive filter unit 17, Moreover, filter coefficient updater 23 sequentially updates the coefficient of the adaptive filter. Coefficient W of the adaptive filter is expressed as Expression 1 below, where "e" denotes a vector of the corrected error signal and "R" denotes a vector of the filtered reference signal. Note that n is a natural number and represents an n-th sample in sampling period Ts. Here, p is a scalar quantity and is a step size parameter that determines an amount of updating of coefficient W of the adaptive filter per sampling.

[Math. 1]

$$W(n+1)=W(n)-\mu \cdot e(n) \cdot R(n) \quad \text{Expression 1)}$$

Note that filter coefficient updater 23 may update coefficient W of the adaptive filter with a method other than the LMS method.

As described above, active noise reduction device 10 includes simulated vibration transfer characteristics filter unit 15 and first subtracter 16, as structural elements for reducing signal components included in the reference signal and having a correlation with a sound that is based on external sound source 54. Moreover, active noise reduction device 10 includes first simulated acoustic transfer characteristics filter unit 20 and second subtracter 21, as structural elements for reducing signal components included in the error signal and having a correlation with a sound that is based on external sound source 54. Such active noise reduction device 10 can prevent a sound based on external sound source 54 from being reduced by the canceling sound and effectively reduce noise N0.

Note that in Embodiment 1, the sound based on external sound source 54 and the canceling sound are outputted from the same loudspeaker 52, but may be outputted from mutually different loudspeakers. For example, a sound based on external sound source 54 may be outputted from a first loudspeaker, and a canceling sound may be outputted from a second loudspeaker different from the first loudspeaker. In this case, active noise reduction device 10 does not include adder 19. Moreover, in this case, simulated vibration transfer characteristics are transfer characteristics that simulate vibration transfer characteristics from the position of the first loudspeaker to the position of reference signal source 51, and include characteristics of signal adjuster 18. First simulated acoustic transfer characteristics simulate acoustic transfer characteristics from the position of the first loudspeaker to the position of error signal source 53. Second simulated acoustic transfer characteristics simulate acoustic transfer characteristics from the position of the second loudspeaker to the position of error signal source 53.

Embodiment 2

[Configuration of Active Noise Reduction Device according to Embodiment 2]

Figure 4A:
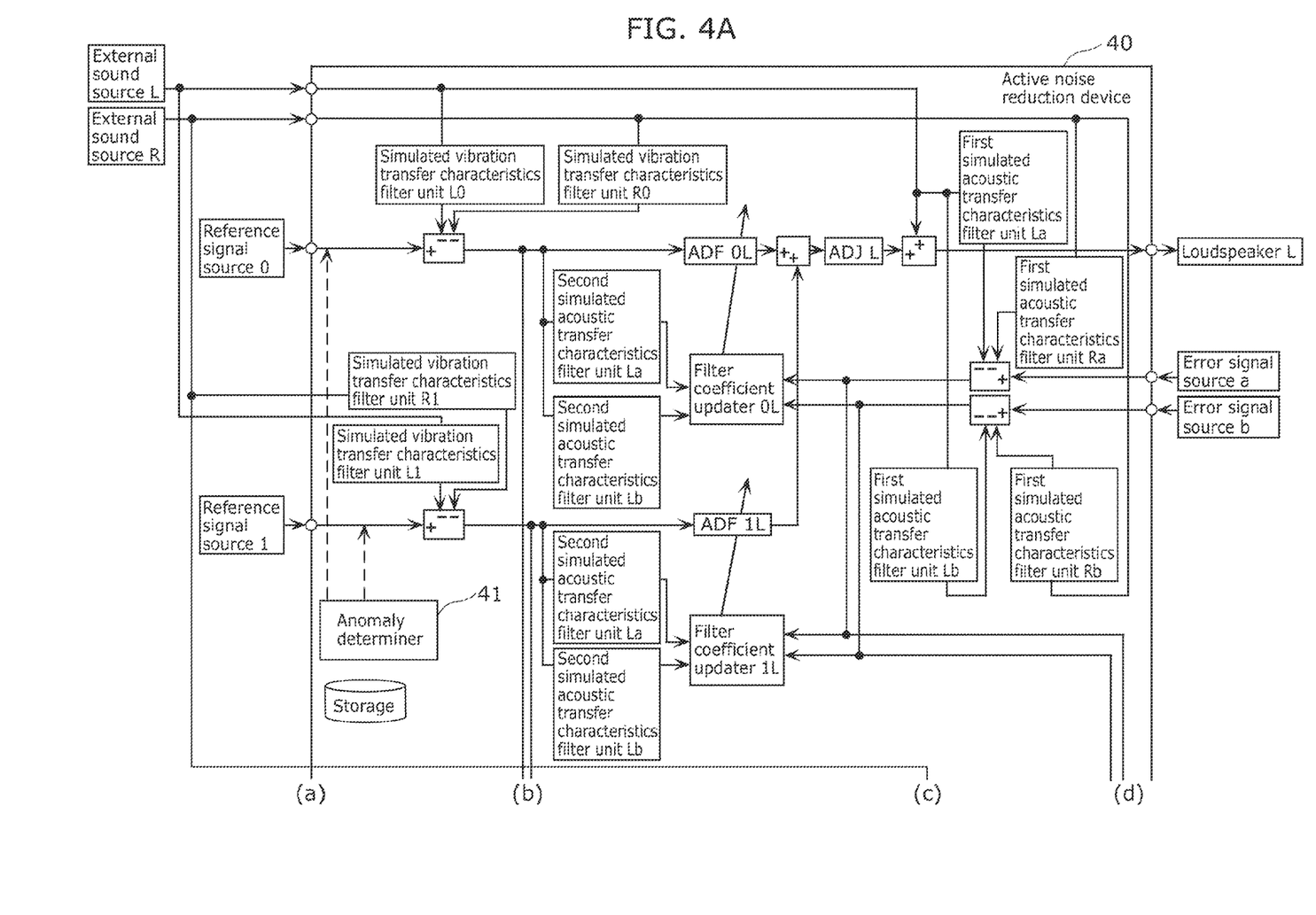
FIG. 4A is a first block diagram illustrating a functional configuration of an active noise reduction device according to Embodiment 2.
Figure 4B:
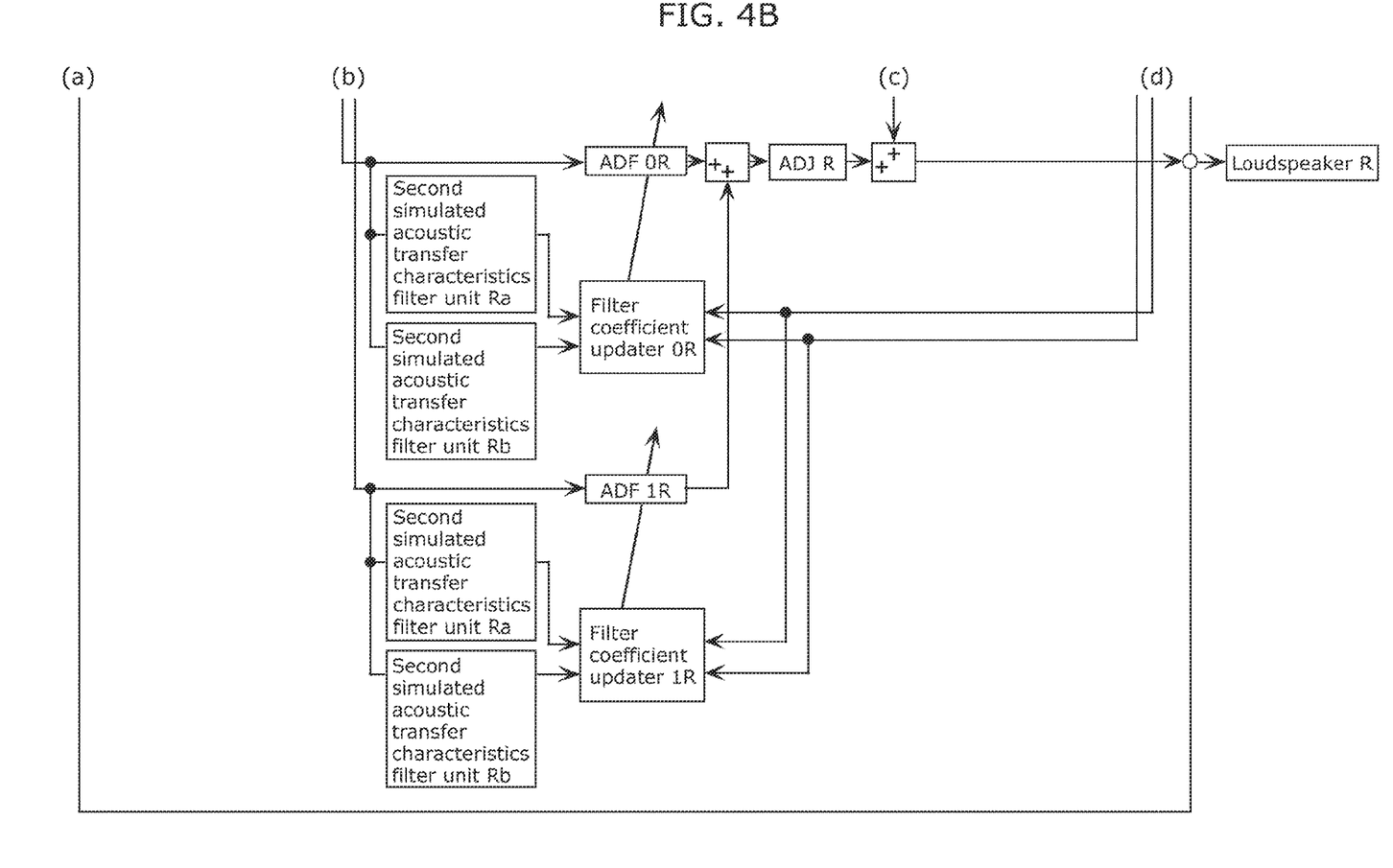
FIG. 4B is a second block diagram illustrating a functional configuration of the active noise reduction device according to Embodiment 2.

Embodiment 1 describes the simplest embodiment of active noise reduction device 10 in which one reference signal source, one loudspeaker, and one error signal source are included. However, in fact, a plurality of reference signal sources, a plurality of loudspeakers, and a plurality of error signals are often included. Therefore, Embodiment 2 describes such a configuration of an active noise reduction device. FIG. 4A and FIG. 4B are each a block diagram illustrating a functional configuration of an active noise reduction device according to Embodiment 2. FIG. 4A and FIG. 4B are originally one diagram, but the one diagram is divided into two diagrams due to size limitations. In these figures, (a) through (d) in FIG. 4A are connected to (a) through (d) in FIG. 4B, respectively. Note that in Embodiment 2, detailed description of the matters that have been already described will be omitted.

As illustrated in FIG. 4A and FIG. 4B, active noise reduction device 40 according to Embodiment 2 includes two reference signal sources, two loudspeakers, and two error signal sources. The number of external sound sources is also two, Therefore, active noise reduction device 40 includes two reference signal input terminals, two canceling signal output terminals, two error signal input terminals, and two external signal input terminals. In FIG. 4A and FIG. 4B, each of the terminals is indicated by a white circle.

In addition, active noise reduction device 40 includes four simulated vibration transfer characteristics filter units. The number of simulated vibration transfer characteristics filter units is determined by, for example, the number of external sound sources×the number of loudspeakers. In FIG. 4A and FIG. 4B, a symbol at the end of a simulated vibration transfer characteristics filter unit indicates vibration transfer characteristics of from which loudspeaker to which reference signal source the vibration transfer characteristics to be used by the simulated vibration transfer characteristics filter unit simulate. For example, simulated vibration transfer characteristics to be used by simulated vibration transfer characteristics filter unit L0 simulate vibration transfer characteristics from the position of loudspeaker L to the position of reference signal source 0.

Moreover, active noise reduction device 40 includes four first simulated acoustic transfer characteristics filter units. The number of first simulated acoustic transfer characteristics filter units is determined by, for example, the number of loudspeakers×the number of error signal sources. A symbol at the end of a first simulated acoustic transfer characteristics filter unit indicates acoustic transfer characteristics of from which loudspeaker to which error signal source the first simulated acoustic transfer characteristics to be used by the first simulated acoustic transfer characteristics filter unit simulate. For example, simulated acoustic transfer characteristics to be used by first simulated acoustic transfer characteristics filter unit La simulate acoustic transfer characteristics from the position of loudspeaker L to the position of reference signal source a.

Moreover, active noise reduction device 40 includes four sets of adaptive filter units (ADF in the figures) and filter coefficient updaters, and two signal adjustment updaters (ADJ in the figures). The number of sets of adaptive filter units and filter coefficient updaters, and the number of signal adjusters are each determined by, for example, the number of reference signal sources×the number of loudspeakers. Active noise reduction device 40 includes two second simulated acoustic transfer characteristics filter units for one filter coefficient updater. In other words, active noise reduction device 40 includes eight second simulated acoustic transfer characteristics filter units.

A symbol at the end of a second simulated acoustic transfer characteristics filter unit indicates acoustic transfer characteristics of from which loudspeaker to which error signal source the second simulated acoustic transfer characteristics to be used by the second simulated acoustic transfer characteristics filter unit simulate. For example, simulated vibration transfer characteristics to be used by second simulated acoustic transfer characteristics filter unit La simulate acoustic transfer characteristics from the position of loudspeaker L to the position of error signal source a.

Such active noise reduction device 40 was actually mounted on automobile 50 and evaluated the sound based on the external sound source. As a result, there are cases where the sound quality based on the external sound source can be maintained even though only at least part of the first simulated acoustic transfer characteristics filter units is enabled and the remaining first simulated acoustic transfer characteristics filter units are disabled. In such cases, at least part of the first simulated acoustic transfer characteristics filter units may be disabled. In other words, at least part of first simulated acoustic transfer characteristics filter units may be disabled beforehand by tuning by an installer, developer, or the like of active noise reduction device 40. This will reduce processing load (amount of computation) and reduce storage resources, for example.

Similarly, there are cases where the quality of sound based on the external sound source can be maintained even though only at least part of the simulated vibration transfer characteristics filter units is enabled and the remaining simulated vibration transfer characteristics filter units are disabled. In such cases, at least part of the simulated vibration transfer characteristics filter units may be disabled. In other words, at least part of simulated vibration transfer characteristics filter units may be disabled beforehand by tuning by an installer, developer, or the like. This will reduce processing load (amount of computation) and reduce storage resources, for example.

[Operation using Anomaly Determiner of Active Noise Reduction Device according to Embodiment 2]

Active noise reduction device 40 also includes anomaly determiner 41. Anomaly determiner 41 detects a DC offset of each of the inputted reference signals and stops at least part of operation of the structural elements included in active noise reduction device 40, based on the detection result. Specifically, anomaly determiner 41 may be implemented by a microcomputer, but may be implemented by a processor or a dedicated circuit.

Figure 5:
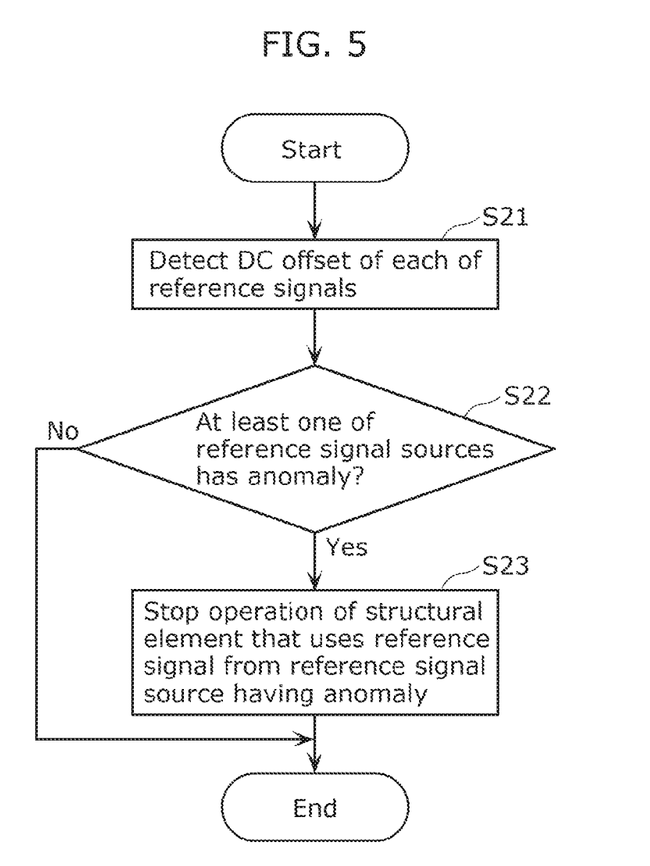
FIG. 5 is a flowchart of an operation of an anomaly determiner included in the active noise reduction device according to Embodiment 2.

Hereinafter, an operation of such anomaly determiner 41 will be described. FIG. 5 is a flowchart of an operation of anomaly determiner 41. Note that the operation in FIG. 5 is performed while active noise reduction device 40 is actually operating (i.e., during output of synthetic sound N1).

First, anomaly determiner 41 detects a DC offset of each of reference signals obtained from the reference signal input terminals (S21). Specifically, anomaly determiner 41 digitizes and averages each of the reference signals to obtain a DC offset. The method of detecting a DC offset is not limited to this method, and other methods may be used.

Next, anomaly determiner 41 determines whether at least one of the reference signal sources has an anomaly, based on the detected DC offset (S22). For example, if a reference signal source has a failure, the DC offset may be maintained at a positive supply voltage. Therefore, for example, anomaly determiner 41 can determine that a reference signal source having a detected DC offset that exceeds a predetermined value for greater than or equal to a predetermined amount of time is a reference signal source having a failure.

If all of the reference signal sources are determined to be normal (No in S22), the anomaly determination operation is ended. On the other hand, if at least one of the reference signal sources is determined to have an anomaly (Yes in S22), anomaly determiner 41 stops the operation of the structural element that uses the reference signal outputted from the reference signal source determined to have an anomaly (S23).

For example, if reference signal source 1 is normal and reference signal source 0 has an anomaly, the operation of simulated vibration transfer characteristics filter unit L0 and the operation of simulated vibration transfer characteristics filter unit R0 that are used for correction of the reference signal outputted from reference signal source 0 are stopped. Moreover, operation of two sets of adaptive filter units, filter coefficient updaters, and signal adjusters that use the reference signal outputted from reference signal source 0 are stopped. Also, the operation of four second simulated acoustic transfer characteristics filter units associated with the stopped two filter coefficient updaters are stopped.

As described above, if the operation of a structural element that uses a reference signal outputted from the reference signal source that is determined to have an anomaly is stopped, this prevents a canceling sound from being an abnormal sound. Moreover, this also reduces processing load (amount of computation) and reduce storage resources, for example.

[Effects, etc.]

As described above, active noise reduction device 10 includes: reference signal input terminal 11 that receives a reference signal outputted by reference signal source 51 and having a correlation with noise N0 in space 56 in automobile 50, reference signal source 51 being attached to automobile 50; simulated vibration transfer characteristics filter unit 15 that generates a second signal by correcting, using simulated vibration transfer characteristics, a first signal for outputting, from loudspeaker 52 attached to automobile 50, a sound different from a canceling sound for reducing noise N0, the simulated vibration transfer characteristics simulating vibration transfer characteristics from loudspeaker 52 to reference signal source 51; first subtracter 16 that outputs a corrected reference signal obtained by subtracting the second signal generated, from the reference signal received by reference signal input terminal 11; and adaptive filter unit 17 that applies an adaptive filter to the corrected reference signal outputted from first subtracter 16 to generate a canceling signal to be used to output the canceling sound. Automobile 50 is an example of a vehicle and reference signal input terminal 11 is an example of a reference signal input.

Since such active noise reduction device 10 includes simulated vibration transfer characteristics filter unit 15 and first subtracter 16, active noise reduction device 10 can reduce signal components included in the reference signal and having a correlation with a sound different from the canceling sound. Therefore, active noise reduction device 10 can prevent a sound other than noise N0 (i.e., a sound different from the canceling sound) from being reduced.

Moreover, for example, active noise reduction device 10 further includes: canceling signal output terminal 12 for outputting the canceling signal generated to an outside; error signal input terminal 13 that receives an error signal corresponding to a residual sound resulting from interference between the canceling sound and noise N0; first simulated acoustic transfer characteristics filter unit 20 that generates a third signal by correcting the first signal using first simulated acoustic transfer characteristics that simulate acoustic transfer characteristics in space 56; second subtracter 21 that outputs a corrected error signal obtained by subtracting the third signal generated, from the error signal received by error signal input terminal 13; second simulated acoustic transfer characteristics filter unit 22 that generates a filtered reference signal by correcting the corrected reference signal using second simulated acoustic transfer characteristics that simulate acoustic transfer characteristics in space 56; and filter coefficient updater 23 that updates a coefficient of the adaptive filter using the corrected error signal outputted and the filtered reference signal generated. Canceling signal output terminal 12 is an example of a canceling signal output, and error signal input terminal 13 is an example of an error signal input.

Since such active noise reduction device 10 includes first simulated acoustic transfer characteristics filter unit 20 and second subtracter 21, active noise reduction device 10 can reduce signal components included in the error signal and having a correlation with a sound based on a sound different from the canceling sound. Therefore, active noise reduction device 10 can prevent a sound other than noise N0 (i.e., a sound different from the canceling sound) from being reduced.

Moreover, for example, active noise reduction device 10 further includes adder 19 that adds the first signal to the canceling signal. The canceling signal to which the first signal is added is outputted to loudspeaker 52 via canceling signal output terminal 12.

Such active noise reduction device 10 can output, from loudspeaker 52, a synthetic sound obtained by synthesizing the canceling sound and a sound different from the canceling sound.

Moreover, for example, active noise reduction device 10 further includes signal adjuster 18 that adjusts, by signal processing, the canceling signal generated.

Such active noise reduction device 10 can adjust, for example, the signal level (amplitude) of the canceling sound.

Moreover, for example, active noise reduction device 40 includes a plurality of first simulated acoustic transfer characteristics filter units each being the first simulated acoustic transfer characteristics filter unit. At least part of the plurality of first simulated acoustic transfer characteristics filter units is disabled.

Such active noise reduction device 40 can reduce processing load (amount of computation) and storage resources, for example, by disabling a first simulated acoustic transfer characteristics filter unit having a small effect on the quality of a sound other than the canceling sound.

Moreover, for example, active noise reduction device 40 includes a plurality of simulated vibration transfer characteristics filter units each being the simulated vibration transfer characteristics filter unit. At least part of the plurality of simulated vibration transfer characteristics filter units is disabled.

Such active noise reduction device 40 can reduce processing load (amount of computation) and storage resources, for example, by disabling a simulated vibration transfer characteristics filter unit having a small effect on the quality of a sound other than the canceling sound.

Moreover, for example, active noise reduction device 40 includes: a plurality of reference signal input terminals corresponding to the plurality of reference signal sources, the plurality of reference signal input terminals each being the reference signal input terminal; and anomaly determiner 41 determines whether the plurality of reference signal sources have an anomaly. Anomaly determiner 41 stops an operation of the simulated vibration transfer characteristics filter unit that is used to correct the reference signal from the reference signal source that has been determined to have an anomaly, and stops a convolution operation of the adaptive filter unit that receives the reference signal from the reference signal source that has been determined to have an anomaly.

Such active noise reduction device 40 can reduce processing load (amount of computation) and storage resources, for example, by stopping the operation of the simulated vibration transfer characteristics filter unit that is used to correct the reference signal outputted from the reference signal source that has been determined to have an anomaly.

Moreover, an active noise reduction method to be executed by a computer such as active noise reduction device 10 includes: generating a second signal by correcting, using simulated vibration transfer characteristics, a first signal for outputting, from loudspeaker 52 attached to automobile 50, a sound different from a canceling sound for reducing noise N0 in space 56 in automobile 50, the simulated vibration transfer characteristics simulating vibration transfer characteristics from loudspeaker 52 to reference signal source 51 attached to automobile 50; outputting a corrected reference signal obtained by subtracting the second signal generated, from the reference signal outputted by reference signal source 51; and applying an adaptive filter to the corrected reference signal outputted to generate a canceling signal to be used to output the canceling sound.

Such an active noise reduction method can prevent a sound other than noise N0 (i.e., a sound different from the canceling sound) from being reduced.

Other Embodiments

Embodiments have been described above, but the present disclosure is not limited to the embodiments described above.

For example, the noise mainly targeted by the active noise reduction device according to the embodiments is road noise, but may be other noise, such as structure-borne noise or airborne noise. The types and bands of noise mainly targeted by the active noise reduction device are not particularly limited.

Moreover, the active noise reduction devices according to the embodiments described above may be mounted on a vehicle other than an automobile. For example, a vehicle may be an aircraft or a ship. Moreover, the present disclosure may be implemented as such a vehicle other than an automobile.

Moreover, the configurations of the active noise reduction devices according to the embodiments described above are examples. For example, each active noise reduction device may include a structural element such as a digital-analog (D/A) converter, a filter, a power amplifier, or an analog-digital (A/D) converter.

Moreover, the processing operations performed by the active noise reduction device according to the embodiments described above are examples. For example, part of the digital signal processing described in the above embodiments may be implemented by analogue signal processing.

Moreover, for example, in the embodiments described above, the processing performed by a particular processing unit may be performed by another processing unit. Moreover, the order of a plurality of processing operations may be changed and a plurality of processing operations may be performed in parallel.

Moreover, in the embodiments described above, each structural element may be implemented by executing an appropriate software program for the structural element. Each structural element may be implemented by a program execution unit, such as a CPU or a processor, reading and executing a software program recorded on a recording medium such as a hard disk or semiconductor memory.

Moreover, in the embodiments described above, each structural element may be implemented by hardware. For example, each structural element may be a circuit (or integrated circuit), These circuits may constitute one circuit as a whole, or each circuit may be a separate circuit. Each of these circuits may be a general-purpose circuit or a dedicated circuit.

Moreover, each structural element may be a circuit (or integrated circuit). These circuits may constitute one circuit as a whole, or each circuit may be a separate circuit. Each of these circuits may be a general-purpose circuit or a dedicated circuit.

Moreover, the general or specific aspects of the present disclosure may be implemented by a system, a device, a method, an integrated circuit, a computer program, or a non-transitory computer-readable recording medium, such as a CD-ROM. Moreover, the general or specific aspects of the present disclosure may be implemented as any combination of systems, devices, methods, integrated circuits, computer programs, and non-transitory computer-readable recording media.

For example, the present disclosure may be implemented as an active noise reduction method executed by an active noise reduction device (computer or DSP), or as a program for causing a computer or DSP to execute the above active noise reduction method. Moreover, the present disclosure may be implemented as a vehicle (for example, an automobile) including one of the active noise reduction devices according to the embodiments described above and a reference signal source. Moreover, the present disclosure may be implemented as the noise reduction system according to one of the embodiments described above.

Other embodiments implemented through various changes and modifications conceived by a person of ordinary skill in the art based on the above embodiments or through a combination of the structural elements in the above embodiments in any manner that does not depart from the scope of the present disclosure may be included in the scope in an aspect or aspects according to the present disclosure.

While various embodiments have been described herein above, it is to be appreciated that various changes in form and detail may be made without departing from the spirit and scope of the present disclosure as presently or hereafter claimed.

Further Information about Technical Background to this Application

The disclosures of the following patent applications including specification, drawings and claims are incorporated herein by reference in their entirety: Japanese Patent Application No, 2019-216574 filed on Nov. 29, 2019 and PCT International Application No. PCT/JP2020/043146 filed on Nov. 19, 2020.

INDUSTRIAL APPLICABILITY

The active noise reduction devices according to the present disclosure are useful as devices capable of reducing noise in an automobile cabin, for example.

The invention claimed is:

1. An active noise reduction device comprising:
a reference signal input that receives a reference signal outputted by a reference signal source and having a correlation with noise in a space in a vehicle, the reference signal source being attached to the vehicle;
a simulated vibration transfer characteristics filter unit that generates a second signal by correcting, using simulated vibration transfer characteristics, a first signal for outputting, from a loudspeaker attached to the vehicle, a sound different from a canceling sound for reducing the noise, the simulated vibration transfer characteristics simulating vibration transfer characteristics from the loudspeaker to the reference signal source;
a first subtracter that outputs a corrected reference signal obtained by subtracting the second signal generated, from the reference signal received by the reference signal input;
an adaptive filter unit that applies an adaptive filter to the corrected reference signal outputted from the first subtracter to generate a canceling signal to be used to output the canceling sound;
a canceling signal output for outputting the canceling signal generated to an outside;
an error signal input that receives an error signal corresponding to a residual sound resulting from interference between the canceling sound and the noise;
a first simulated acoustic transfer characteristics filter unit that generates a third signal by correcting the first signal using first simulated acoustic transfer characteristics that simulate acoustic transfer characteristics in the space;
a second subtracter that outputs a corrected error signal obtained by subtracting the third signal generated, from the error signal received by the error signal input;
a second simulated acoustic transfer characteristics filter unit that generates a filtered reference signal by correcting the corrected reference signal using second simulated acoustic transfer characteristics that simulate acoustic transfer characteristics in the space; and
a filter coefficient updater that updates a coefficient of the adaptive filter using the corrected error signal outputted and the filtered reference signal generated.

2. The active noise reduction device according to claim 1, further comprising:
an adder that adds the first signal to the canceling signal, wherein the canceling signal to which the first signal is added is outputted to the loudspeaker via the canceling signal output.

3. The active noise reduction device according to claim 1, comprising:
a plurality of first simulated acoustic transfer characteristics filter units each being the first simulated acoustic transfer characteristics filter unit,
wherein at least part of the plurality of first simulated acoustic transfer characteristics filter units is disabled.

4. The active noise reduction device according to claim 1, comprising:
a plurality of simulated vibration transfer characteristics filter units each being the simulated vibration transfer characteristics filter unit,
wherein at least part of the plurality of simulated vibration transfer characteristics filter units is disabled.

5. The active noise reduction device according to claim 1, further comprising:
a signal adjuster that adjusts, by signal processing, the canceling signal generated.

6. The active noise reduction device according to claim 1, further comprising:
a plurality of reference signal inputs corresponding to the plurality of reference signal sources, the plurality of reference signal inputs each being the reference signal input; and
an anomaly determiner that determines whether the plurality of reference signal sources has an anomaly,
wherein the anomaly determiner stops an operation of the simulated vibration transfer characteristics filter unit that is used to correct the reference signal from the reference signal source that has been determined to have an anomaly, and stops a convolution operation of the adaptive filter unit that receives the reference signal from the reference signal source that has been determined to have an anomaly.

7. A vehicle comprising:
the active noise reduction device according to claim 1; and
the reference signal source.

8. An active noise reduction method to be executed by a computer, the active noise reduction method comprising:
generating a second signal by correcting, using simulated vibration transfer characteristics, a first signal for outputting, from a loudspeaker attached to a vehicle, a sound different from a canceling sound for reducing noise in a space in the vehicle, the simulated vibration transfer characteristics simulating vibration transfer characteristics from the loudspeaker to a reference signal source attached to the vehicle;
outputting a corrected reference signal obtained by subtracting the second signal generated, from the reference signal outputted by the reference signal source;
applying an adaptive filter to the corrected reference signal outputted to generate a canceling signal to be used to output the canceling sound;
outputting the canceling signal generated to an outside;
receiving an error signal corresponding to a residual sound resulting from interference between the canceling sound and the noise;
generating a third signal by correcting the first signal using first simulated acoustic transfer characteristics that simulate acoustic transfer characteristics in the space;
outputting a corrected error signal obtained by subtracting the third signal generated, from the received error signal;
generating a filtered reference signal by correcting the corrected reference signal using second simulated acoustic transfer characteristics that simulate acoustic transfer characteristics in the space; and
updating a coefficient of the adaptive filter using the corrected error signal outputted and the filtered reference signal generated.

* * * * *